US007785481B2

(12) United States Patent
Wang

(10) Patent No.: US 7,785,481 B2
(45) Date of Patent: Aug. 31, 2010

(54) METHOD FOR FABRICATING MICROMACHINED STRUCTURES

(75) Inventor: Chuan Wei Wang, Hsin-Chu (TW)

(73) Assignee: PixArt Imaging Inc., Hsin-Chu County (TW)

( * ) Notice: Subject to any disclaimer, the term of this patent is extended or adjusted under 35 U.S.C. 154(b) by 491 days.

(21) Appl. No.: 11/944,247

(22) Filed: Nov. 21, 2007

(65) Prior Publication Data

US 2009/0090693 A1 Apr. 9, 2009

(30) Foreign Application Priority Data

Oct. 5, 2007 (TW) .............................. 96137396 A

(51) Int. Cl.
*C23F 1/00* (2006.01)

(52) U.S. Cl. ............................................ 216/2; 216/13

(58) Field of Classification Search ..................... 216/2, 216/13; 438/48, 50
See application file for complete search history.

(56) References Cited

U.S. PATENT DOCUMENTS 6,458,615 B1 10/2002 Fedder et al.

*Primary Examiner*—Roberts Culbert

(57) ABSTRACT

A method for fabricating micromachined structures is provided. At least one cavity is formed on a substrate and then a dielectric material different from the material of the substrate is filled in the at least one cavity. Next, a circuitry layer including a first etch-resistant layer and a dielectric layer is formed above the at least one cavity filled with the dielectric material. A portion of the circuitry layer exposed by the first etch-resistant layer is then etched. Finally, the dielectric material in the at least one cavity is etched out.

12 Claims, 8 Drawing Sheets

320
310
3b
3b
322
324

METHOD FOR FABRICATING MICROMACHINED STRUCTURES

CROSS REFERENCE TO RELATED APPLICATION

This application claims the priority benefit of Taiwan Patent Application Serial Number 096137396 filed Oct. 5, 2007, the full disclosure of which is incorporated herein by reference.

BACKGROUND OF THE INVENTION

1. Field of the Invention

The invention relates to methods for fabricating micromachined structures, and more particularly, to methods for fabricating micromachined structures combining bulk substrate etching with micromachining.

2. Description of the Related Art

Microfabrication, also known as micromachining, commonly refers to the use of known semiconductor processing techniques to fabricate devices known as micro-electromechanical systems (MEMS) or micromachined devices. In general, known MEMS fabrication processes involve the sequential addition and removal of layers of material from a substrate layer through the use of film deposition and etching techniques until the desired structure has been realized. Accordingly, MEMS devices typically function under the same principles as their macroscale counterparts. MEMS devices, however, offer advantages in design, performance, and cost in comparison to their macroscale counterparts due to the decrease in scale of MEMS devices. In addition, due to batch fabrication techniques applicable to MEMS technology, significant reductions in per unit cost may be realized.

Micromachined structures are frequently used in MEMS inertial sensors, such as accelerometers and gyroscopes. A MEMS accelerometer using differential capacitors to detect acceleration typically includes three primary micromachined elements: a central, or proof mass, capacitor plates, and springs. FIG. 1 is a top plan view of a typical prior differential capacitor-based micromachined accelerometer 100, including a movable proof mass 102 supported by spring support beams 104. The proof mass 102 includes a plurality of electrodes 108 extending perpendicularly away from the proof mass 102, which are interleaved with a plurality of electrodes 110 extending perpendicularly from support beams 112. These features are formed in a cavity 116 formed in a substrate 118 through conventional etching techniques, and may be anchored to the underlying substrate 118 or cantilevered structures released from the substrate 118. The electrodes 108 and 110 are typically made of polysilicon or a material comprised of multi-films, such as silicon dioxide or aluminum, thereby creating individual parallel-plate capacitors between each adjacent pair of the interleaved electrodes 108, 110. In operation, when the accelerometer 100 is accelerated, the electrodes 108 move relative to the electrodes 110, thereby varying the distance, and hence the capacitance, between the electrodes 108, 110. The variable capacitance can be determined by peripheral circuitry interfacing with connectors 120, which are connected to the electrodes 110 via the support beams 112.

It is known, however, to use CMOS-micromachining processes to create microstructures that are mode out of the dielectric and metallization layers in a CMOS process. According to such processes, one of the CMOS interconnect metal layers, or some other layer made from an etch-resistant mask material, acts as an etch-resistant mask for defining the microstructural sidewalls. A reactive-ion etch of the CMOS oxide layer creates composite metal/dielectric microstructures that can have a high aspect ratio of beam width to beam thickness, and of gaps between the beams to beam thickness.

There are two primary techniques to refine and release CMOS micromachined structures: wet etching and dry plasma etching. Wet etching provides that disadvantage that it generally cannot reproduce complex shaped structures with accurate dimensional control. Dry plasma etching, on the other hand, typically is free from dimensional restrictions. However, the current semiconductor-based plasma systems used for dry plasma etching have very low etch rates, for example, below one μm/min for silicon. The disadvantage is particularly acute when the CMOS microstructure is to be combined with, for example, a bulk silicon substrate, which may have a thickness between 400-500 μm.

A known prior solution for fabricating submicron movable mechanical structures uses a chemically assisted ion beam etch (CAIBE) and a reactive ion etch (RIE). According to the process, an RIE is performed to selectively remove portions of dielectric layers formed on a substrate, such as a GaAs substrate. Next, a CAIBE is performed to selectively remove portions of the GaAs substrate to define the trenches of the structure. Subsequently, a mitride layer is deposited over the structure, including the trenches, by plasma-enhanced chemical vapor deposition (PECVD) to protect the mesa structure. After the nitride layer is formed, the portions of the nitride layer are etched back remove the nitride layer from the bottoms of the trenches, but to retain the nitride layer on the sidewalls of the mesa structure. Next, an RIE process can be used to undercut the substrate material under the structure. This solution thus requires the deposition of materials to protect the microstructure during the etching of the substrate layer, which therefore increases production steps and consequently production cost.

In order to solve above-mentioned problems, referring to FIGS. 2*a* to 2*c*, U.S. Pat. No. 6,458,615 discloses a method for fabricating micromachined structures. First, referring to FIG. 2*a*, a circuitry layer 12 is formed on a substrate 14. The substrate 14 is the lowest layer of material on a wafer. The circuitry layer 12 may be, for example, a CMOS circuitry layer, including CMOS circuitry regions and CMOS interconnect regions 16, formed on the substrate 14 according to conventional CMOS fabrication techniques. The circuitry layer 12 may include dielectric layers 20, polysilicon layers 17 and metal layers 18, including an upper metal layer 19. The dielectric layers 20 may be a silicon dioxide layer.

Next, portions of the dielectric layers 20 of the CMOS circuitry layer 12 are removed by a reactive ion etch (RIE) and the upper metal layer 19 acts as the etching mask. Subsequently, a deep reactive ion etch (DRIE) process is used to remove the portion of the substrate 14 exposed by the upper metal layer 19. The resulting structure assembly is illustrated in FIG. 2*b*. Next, the substrate assembly is subjected to an isotropic etch to remove the beam springs 28 so that the microstructure 22 is released from the substrate 14. The resulting structure assembly is illustrated in FIG. 2*c*.

However, according to the above method for fabricating micromachined structures, the isotropic etch is required to be precisely timed to prevent the substrate material under the CMOS circuitry regions 15 and CMOS interconnect regions 16 from over-etching.

Accordingly, there exists a need to provide a method for fabricating micromachined structures to solve the above-mentioned problems.

SUMMARY OF THE INVENTION

It is an object of the present invention to provide a novel method for fabricating micromachined structures that etches both the circuitry layer and the dielectric material in the cavities of the substrate in one etching process. A metal layer acts as the lateral etch-resistant mask so that the etching to the circuitry layer can be confined in a given region to avoid undesired lateral etching to the circuitry layer during an isotropic etching.

In order to achieve the above object, the method for fabricating micromachined structures according to the first embodiment of the present invention is to form a pattern on a silicon substrate through photolithography. Next, an inductively coupled plasma process is used to etch the substrate so as to form a cavity on the substrate which has a shape corresponding to that of the pattern. After the cavity is formed, the pattern is removed from the substrate. Subsequently, a dielectric material different from the substrate material is deposited in the cavity by plasma-enhanced chemical vapor deposition or by atmospheric pressure chemical vapor deposition. Alternatively, the substrate is subjected to oxidation by heating so that an oxide is formed and filled in the cavity. Next, the portion of the dielectric material covering the surface of the substrate is removed by chemical mechanical polishing to expose the substrate.

Subsequently, a circuitry layer including a first metal layer and a dielectric layer is formed above the cavity filled with the dielectric material. The circuitry layer is then subjected to an isotropic etching through hydrofluoric gas. The first metal layer acts as the longitudinal etch-resistant mask so that only those portions of the dielectric layer exposed by the first metal layer are removed and the portions of the dielectric layer under the first metal layer still remain unetched. Moreover, the dielectric material in the cavity can also be removed in the hydrofluoric gas etching so that the etched circuitry layer can form microstructures and are released from the substrate. Besides, the circuitry layer further includes a second metal layer to act as the lateral etch-resistant mask so that the etching to the circuitry layer can be confined in a given region to avoid undesired lateral etching to the circuitry layer during the isotropic etching.

The method for fabricating micromachined structures according to the second embodiment of the present invention is substantially identical to the method according to the first embodiment. However, according to the method of the second embodiment of the invention, a plurality of cavities is formed on the substrate and the circuitry layer is formed above the cavities filled with the dielectric material. The positions of the cavities formed on the substrate depend on the positions of the microstructures made from the circuitry layer, i.e. under the microstructures. After the circuitry layer is etched and the filled dielectric material is removed out from the cavities, the resulting microstructures are released from the substrate. In this way, more complicated microstructures can be obtained.

The foregoing, as well as additional objects, features and advantages of the invention will be more readily apparent from the following detailed description, which proceeds with reference to the accompanying drawings.

BRIEF DESCRIPTION OF THE DRAWINGS

FIGS. 3*a* to 3*g* illustrate the method for fabricating micromachined structures according to the first embodiment of the present invention, wherein FIG. 3*a* is a top plan view and FIG. 3*b* is a side view taken along line 3*b*-3*b* of FIG. 3*a*.

DETAILED DESCRIPTION OF THE PREFERRED EMBODIMENT

Figure 1:
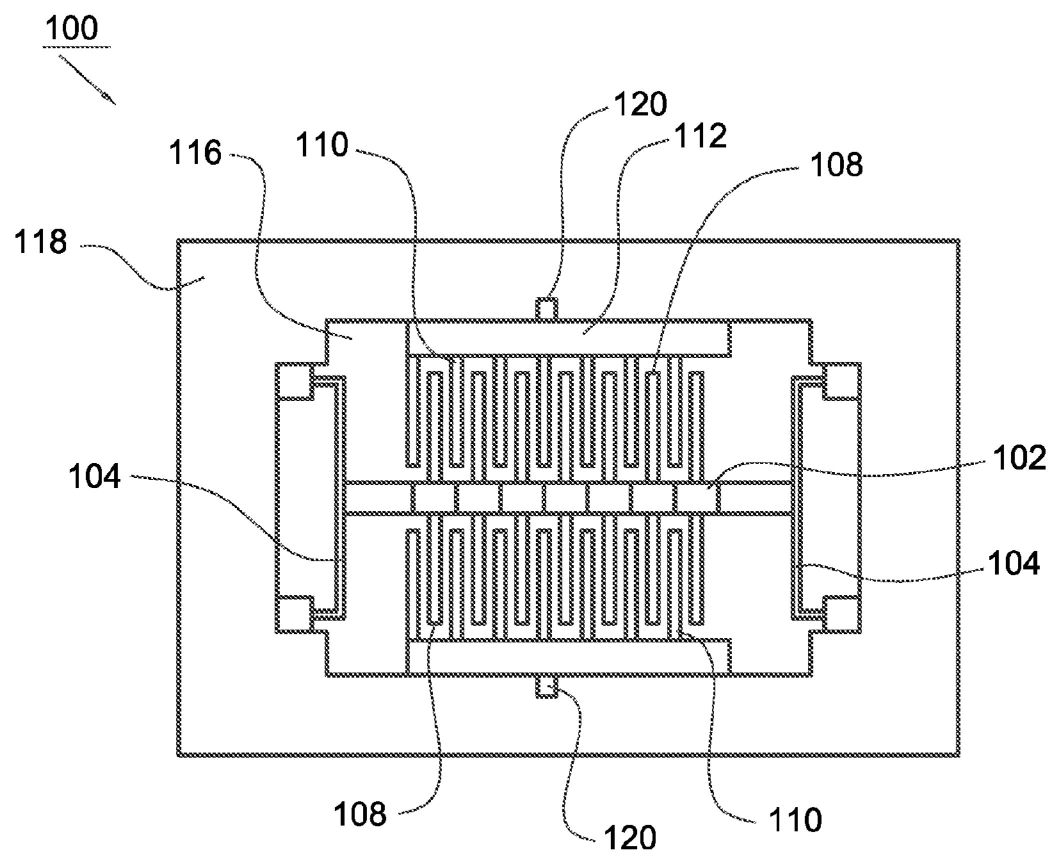
FIG. 1 is a top plan view of a typical prior differential capacitor-based micromachined accelerometer
Figure 2A:
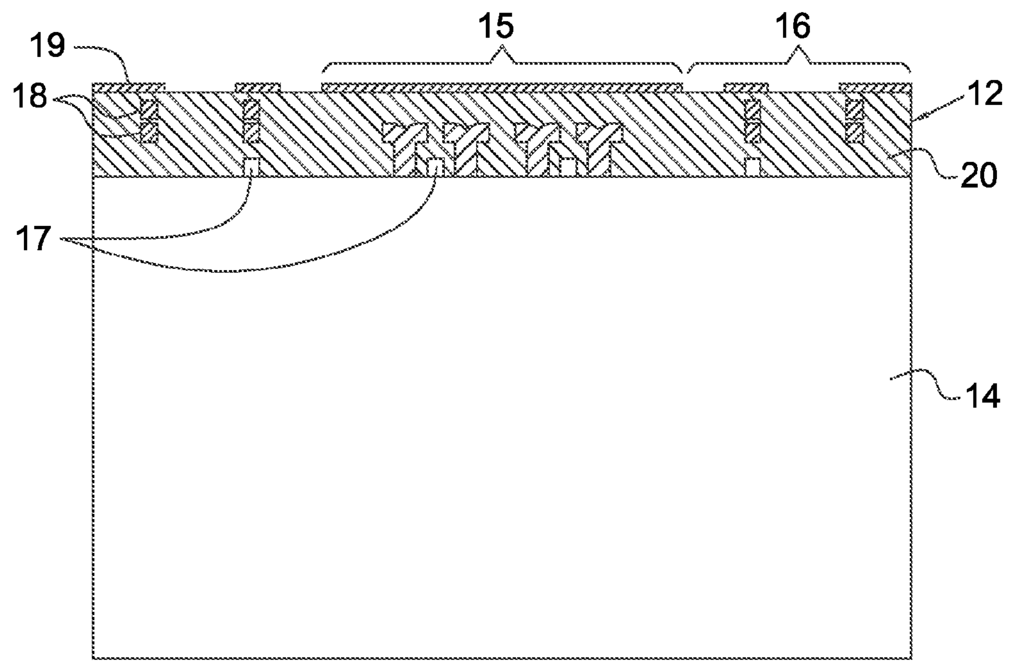
FIGS. 2*a* to 2*c* illustrate a conventional method for fabricating micromachined structures.
Figure 2B:
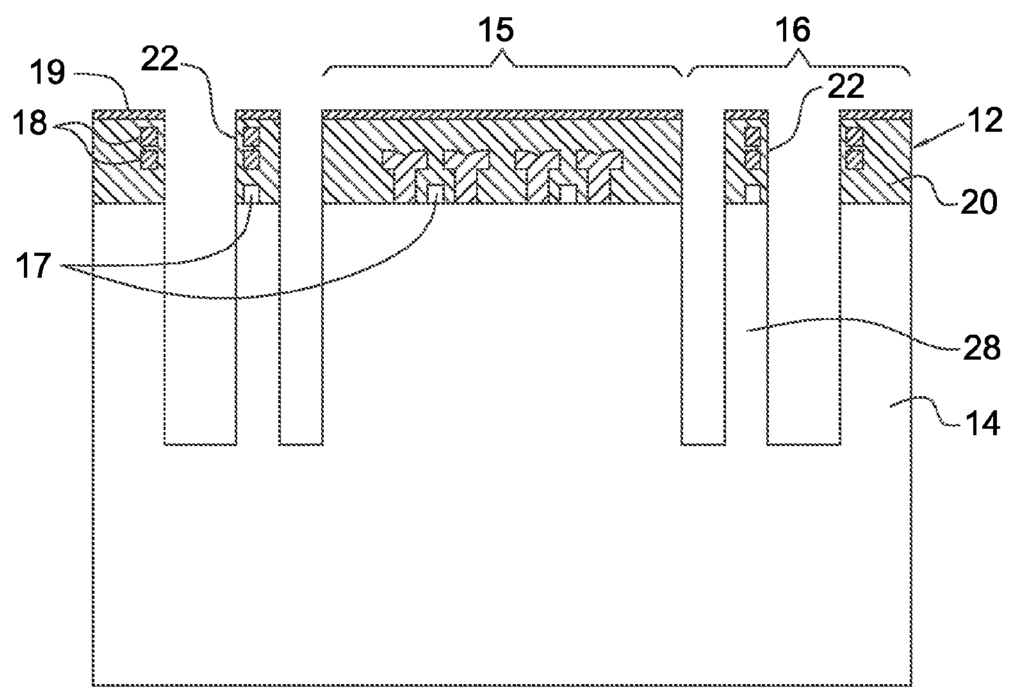
Figure 2C:
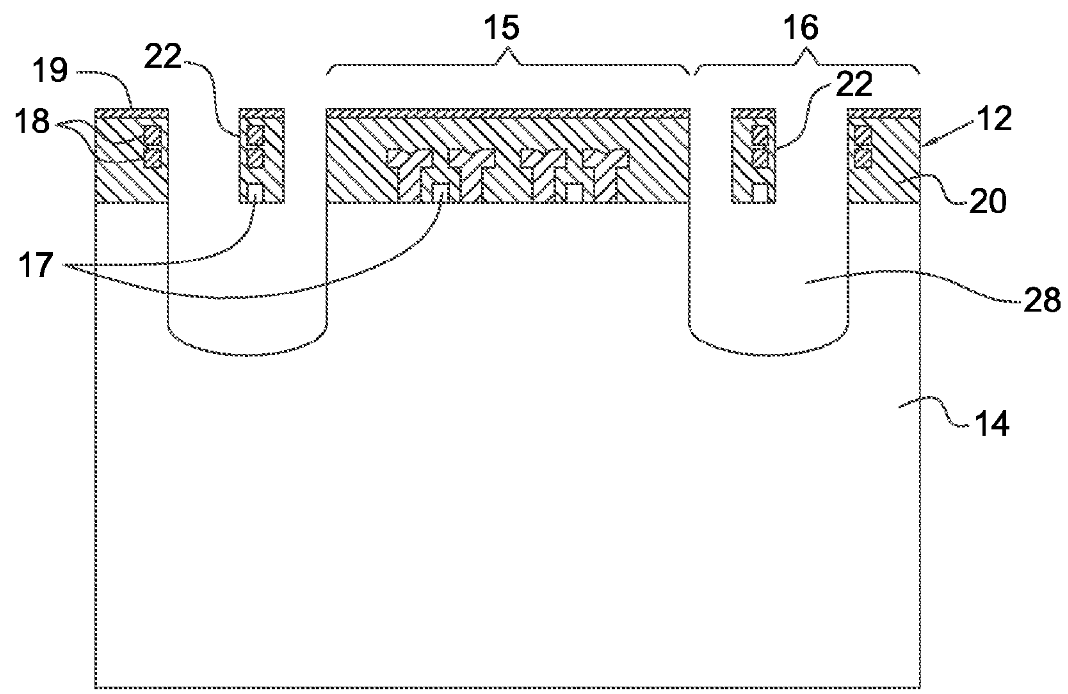
Figure 3A:
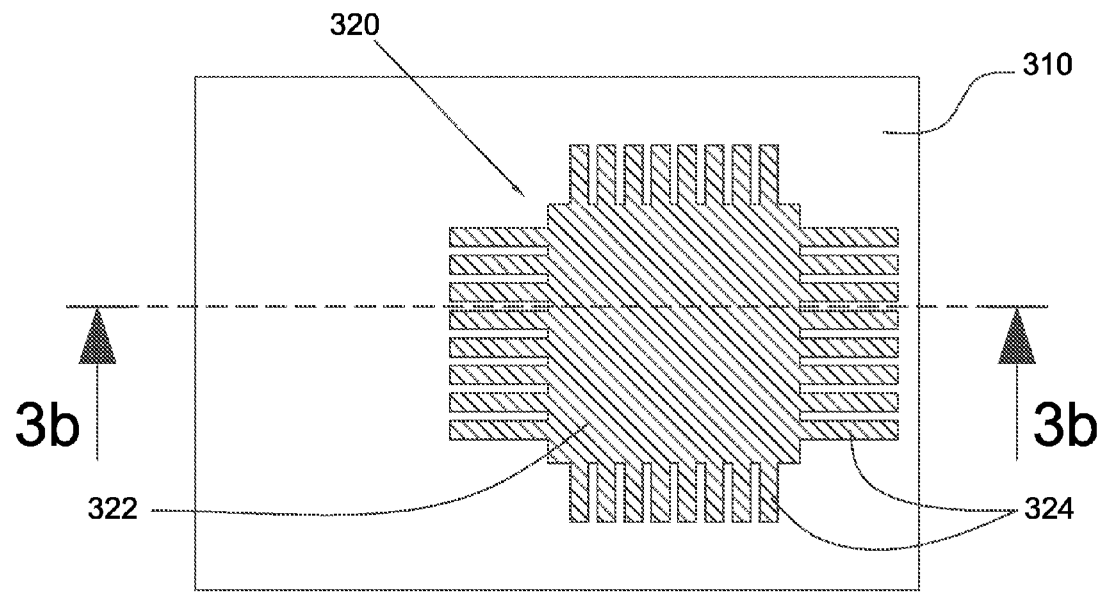
Figure 3B:
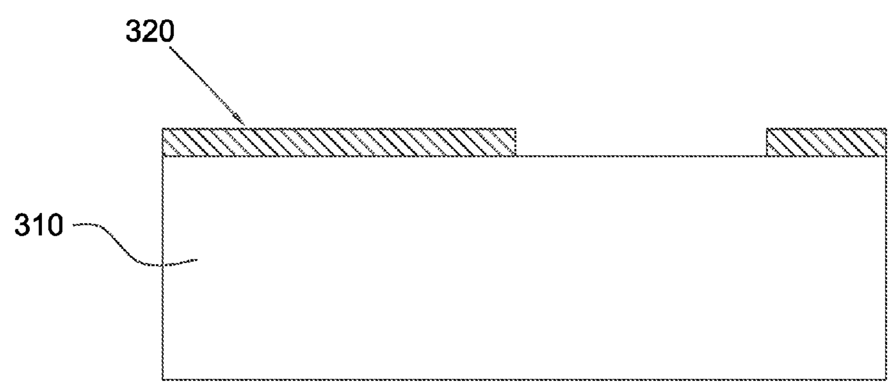

Referring to FIGS. 3*a* and 3*b*, the method for fabricating micromachined structures according to the first embodiment of the present invention is first to form a pattern 320 on a silicon substrate 310 by photolithography. The pattern 320 has a rectangular primary portion 322 and a plurality of protruding portions 324 extending outwardly from the four sides of the primary portion 322 and positioned symmetrically to each other.

Figure 3C:
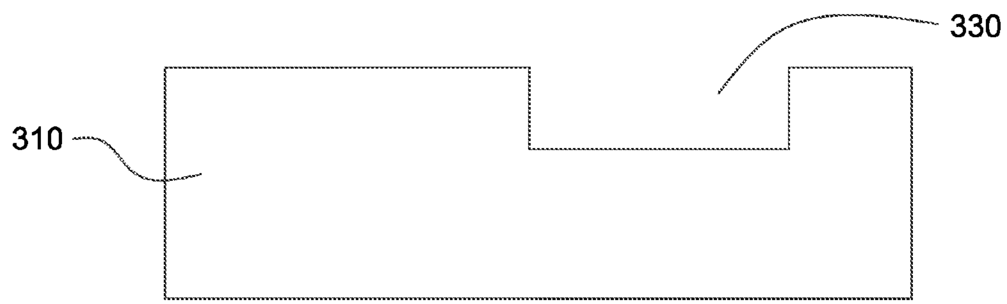

Referring to FIG. 3*c*, an inductively coupled plasma (ICP) process is then used to etch the substrate 310 so as to form a cavity 330 on the substrate 310 which has a shape corresponding to that of the pattern 320. Specifically, the resulting cavity 330 has a primary portion and a plurality of protruding portions extending outwardly from the primary portion and positioned symmetrically to each other (not shown in the figure). After the cavity 330 is formed, the pattern 320 is removed from the substrate 310.

Figure 3D:
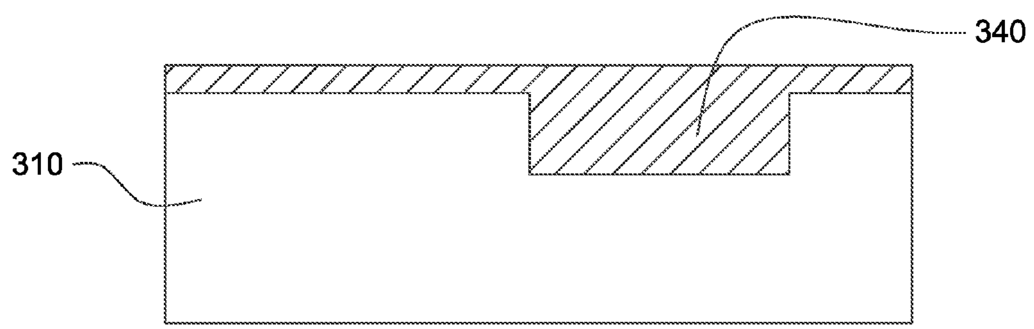

Referring to FIG. 3*d*, a dielectric material 340 different from the material of the substrate, for example, an oxide of the substrate 310, such as silicon dioxide is deposited in the cavity 330 by plasma-enhanced chemical vapor deposition (PECVD) or by atmospheric pressure chemical vapor deposition (APCVD) after the cavity 330 is formed. Alternatively, the substrate 310 is subjected to oxidation by heating so that an oxide such as silicon dioxide is formed and filled in the cavity 330.

Figure 3E:
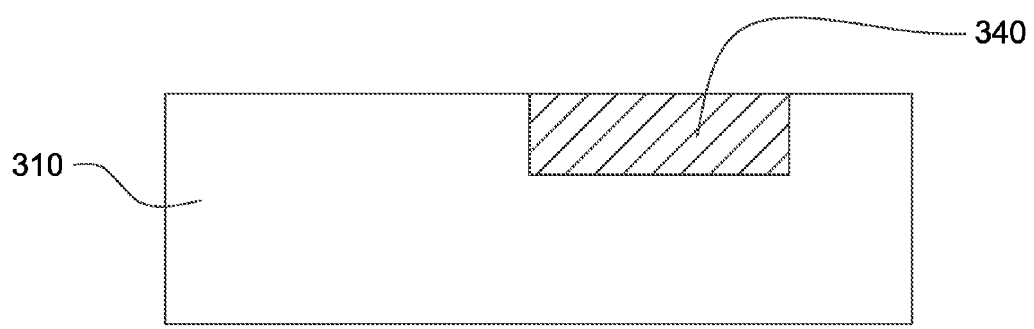

Next, referring to FIG. 3*e*, the portion of the dielectric material 340 covering the surface of the substrate 310 is removed by chemical mechanical polishing (CMP) to expose the substrate 310.

Figure 3F:
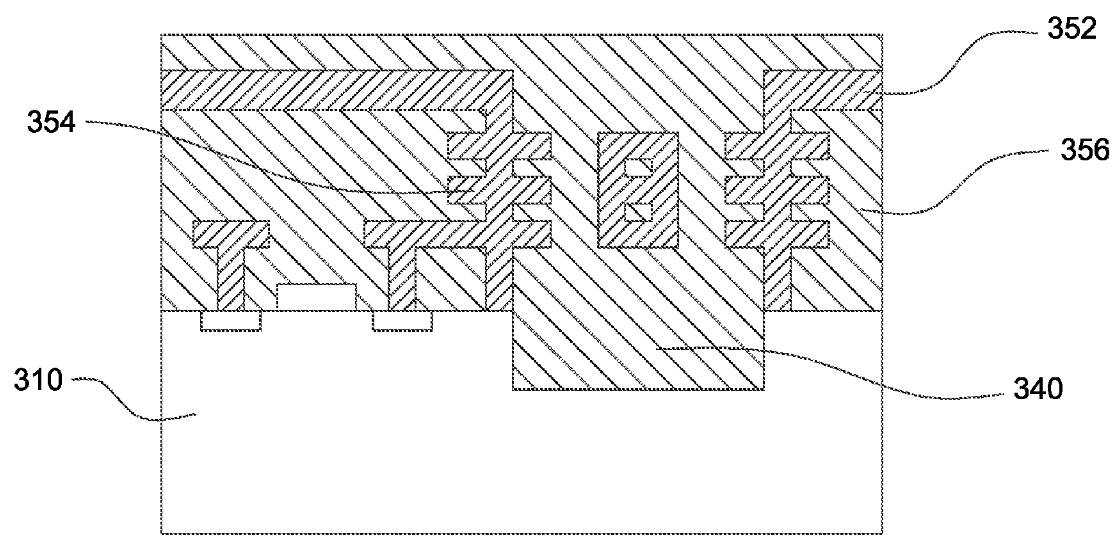
Figure 3G:
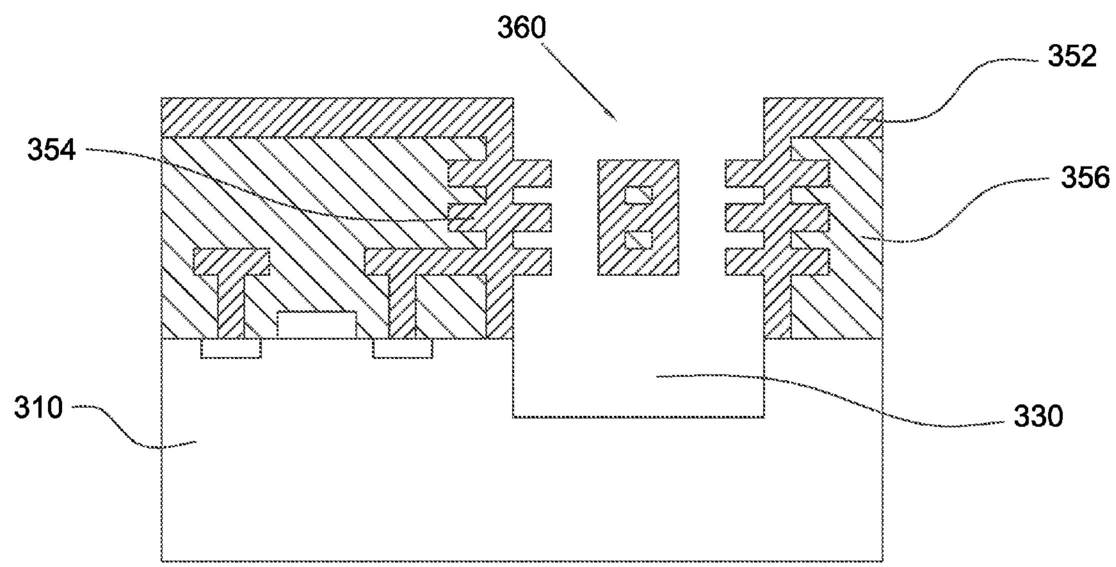

Referring to FIG. 3*f*, a circuitry layer 350 is then formed above the cavity 330 filled with the dielectric material 340. The circuitry layer 340 includes a first metal layer 352 and a dielectric layer 356. Subsequently, referring to FIG. 3*g*, the circuitry layer 350 is subjected to an isotropic etching by hydrofluoric (HF) gas. The first metal layer 352 acts as the longitudinal etch-resistant mask so that only those portions of the dielectric layer 356 exposed by the first metal layer 352 are removed and the portions of the dielectric layer 356 under the first metal layer 352 still remain unetched. Moreover, the dielectric material 340 in the cavity 330 can also be removed in the HF gas etching so that the etched circuitry layer 350 can form microstructures 360 and are released from the substrate 310. Besides, the circuitry layer 350 further includes a second metal layer 354 to act as the lateral etch-resistant mask so that the etching to the circuitry layer 350 can be confined in a given region to avoid undesired lateral etching to the circuitry layer 350 during the isotropic etching.

According to the method for fabricating micromachined structures described in the first embodiment of the present invention, both the circuitry layer 350 and the dielectric material 340 filled in the cavity 330 can be etched in the HF gas etching process. The second metal layer 354 can act as the lateral etch-resistant mask to confine the etching to the circuitry layer 350 in a given region so as to prevent the circuitry layer 350 from over-etching. Moreover, when the dielectric material 340 filled in the cavity 330 is, for example, silicon dioxide, those portions of the substrate 310 around the filled dielectric material 340 will not be over-etched by the HF gas in the process of etching out the filled dielectric material 340 with the HF gas because the HF gas has a selectivity for silicon dioxide over silicon of up to 100:1. Besides, the dielectric material 340 can be more firmly secured in the cavity 330 since the cavity 330 includes the plurality of protruding portions extending from the primary portion to increase the contact area between the dielectric material 340 and cavity 330. This measure can prevent the filled dielectric material 340 from coming off the cavity 330 during the chemical mechanical polishing.

Figure 4:
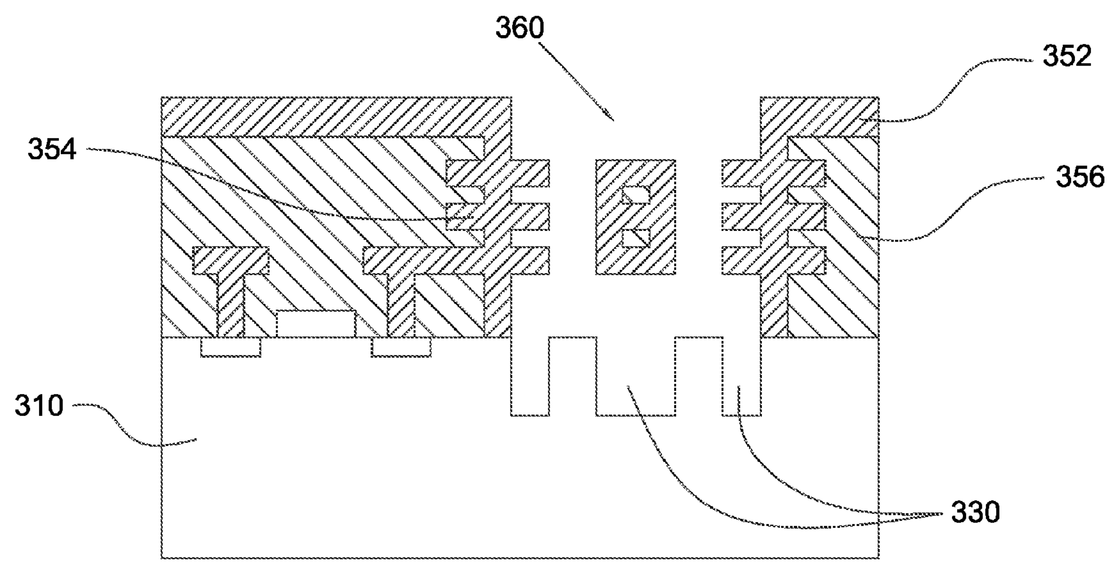
FIG. 4 is a side view of the micromachined structure that is fabricated according to the second embodiment of the present invention.
Figure 5:
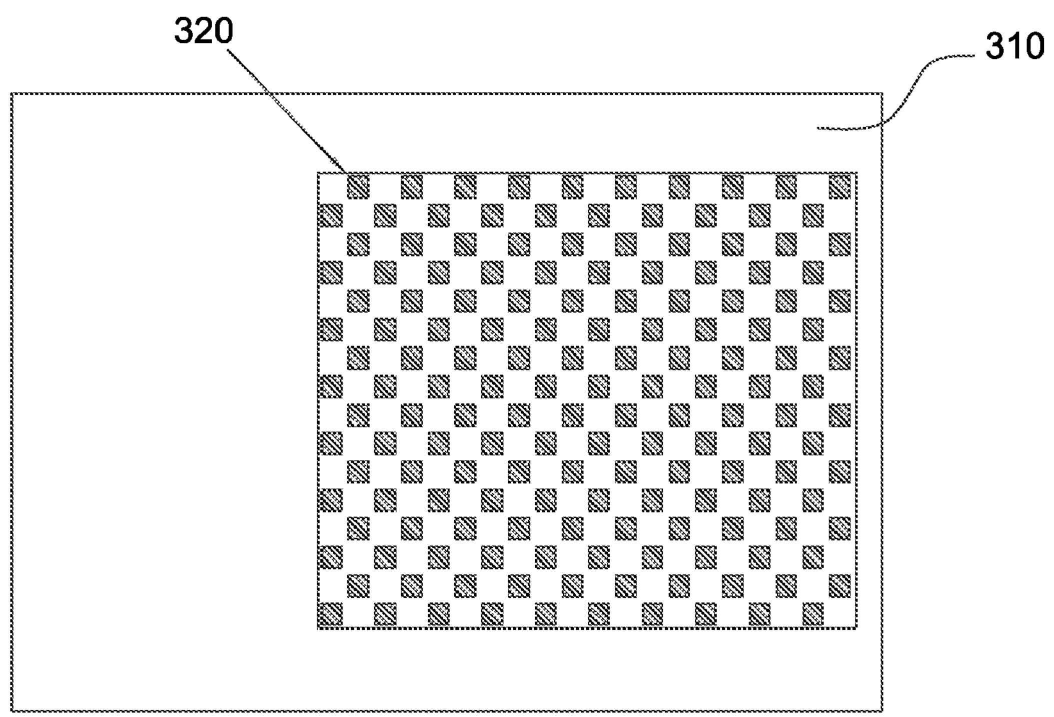
FIG. 5 illustrates the pattern formed on the substrate by photolithography for forming the cavities of FIG. 4.

Referring to FIG. 4, the method for fabricating micromachined structures according to the second embodiment of the present invention is substantially identical to the method according to the first embodiment. However, according to the method of the second embodiment of the invention, a plurality of cavities 330 is formed on the substrate 310 and the circuitry layer 350 is formed above the cavities 330 filled with the dielectric material 340. In order to form the cavities 330 of FIG. 4, the pattern 320 formed on the substrate 310 by photolithography is illustrated in FIG. 5. Moreover, the positions of the cavities 330 formed on the substrate 310 depend on the positions of the microstructures 360 made from the circuitry layer 350, i.e. under the microstructures 360. After the circuitry layer 350 is etched and the filled dielectric material 340 is removed out from the cavities 330, the resulting microstructures 360 are released from the substrate 310. In this way, more complicated microstructures 360 can be obtained.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for fabricating a micromachined structure, comprising the steps of:

providing a substrate;

forming at least one cavity on the substrate;

filling the at least one cavity with a dielectric material different from the material of the substrate;

forming a circuitry layer above the at least one cavity filled with the dielectric material, wherein the circuitry layer comprises a first etch-resistant layer and a dielectric layer;

etching the circuitry layer so that the portion of the dielectric layer exposed by the first etch-resistant layer is removed; and removing the dielectric material in the at least one cavity by etching.

2. The method as claimed in claim 1, wherein the etching to the circuitry layer is an isotropic etching and the circuitry layer further comprises a second etch-resistant layer which acts as the lateral etch-resistant mask.

3. The method as claimed in claim 2, wherein the isotropic etching to the circuitry layer is performed by hydrofluoric gas.

4. The method as claimed in claim 1, wherein the dielectric material filled in the at least one cavity is an oxide of the substrate.

5. The method as claimed in claim 1, wherein the dielectric material is filled in the at least one cavity by plasma-enhanced chemical vapor deposition.

6. The method as claimed in claim 1, wherein the dielectric material is filled in the at least one cavity by atmospheric pressure chemical vapor deposition.

7. The method as claimed in claim 1, wherein the dielectric material is filled in the at least one cavity by heating the substrate to oxidize the surface of the at least one cavity.

8. The method as claimed in claim 1, further comprising:

removing the portion of the dielectric material covering the surface of the substrate by chemical mechanical polishing.

9. The method as claimed in claim 1, wherein the step of forming at least one cavity on the substrate comprising:

forming a pattern on the substrate by photolithography; and etching the substrate by inductively coupled plasma to form at least one cavity on the substrate that has a shape corresponding to the shape of the pattern.

10. The method as claimed in claim 1, wherein the at least one cavity has a primary portion and a plurality of protruding portions extending outwardly from the primary portion.

11. The method as claimed in claim 1, wherein a plurality of cavities is formed on the substrate and the portions of the unetched circuitry layer are positioned above the cavities.

12. The method as claimed in claim 2, wherein the first and second etch-resistant layers are metal layers.

* * * * *